US006919681B2

(12) United States Patent
Cok et al.

(10) Patent No.: US 6,919,681 B2
(45) Date of Patent: Jul. 19, 2005

(54) COLOR OLED DISPLAY WITH IMPROVED POWER EFFICIENCY

(75) Inventors: Ronald S. Cok, Rochester, NY (US); Andrew D. Arnold, Hilton, NY (US); Dustin Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 240 days.

(21) Appl. No.: 10/426,299

(22) Filed: Apr. 30, 2003

(65) Prior Publication Data

US 2004/0217694 A1 Nov. 4, 2004

(51) Int. Cl.$^7$ ............................................... H05B 33/00
(52) U.S. Cl. ..................................... 313/500; 315/169.3
(58) Field of Search ................................ 313/500–512; 315/169.3, 169.1; 345/60

(56) References Cited

U.S. PATENT DOCUMENTS

| | | | |
|---|---|---|---|
| 4,800,375 A | 1/1989 | Silverstein et al. |
| 5,550,066 A | 8/1996 | Tang et al. |
| 5,563,621 A | 10/1996 | Silsby |
| 5,638,084 A | 6/1997 | Kalt |
| 6,075,514 A | 6/2000 | Ryan |
| 6,246,179 B1 | 6/2001 | Yamada |
| 6,366,025 B1 | 4/2002 | Yamada |
| 6,429,599 B1 | 8/2002 | Yokoyama |
| 6,476,419 B1 | 11/2002 | Yasuda |
| 6,501,448 B1 | 12/2002 | Komiya et al. |
| 6,501,466 B1 | 12/2002 | Yamagishi et al. |
| 6,522,079 B1 | 2/2003 | Yamada |
| 2002/0024618 A1 | 2/2002 | Imai |
| 2002/0186214 A1 | 12/2002 | Siwinski |
| 2004/0108978 A1 | 6/2004 | Matsueda et al. |

OTHER PUBLICATIONS

U.S. Appl. No.: 10/426,555 by Winters, entitled Drive Circuitry For Four–Color Organic Light–Emitting Device, filed concurrently, now U.S. Pat No. 6771028 B1.

*Primary Examiner*—Joseph Williams
(74) *Attorney, Agent, or Firm*—Andrew J. Anderson; Thomas H. Close

(57) ABSTRACT

A color OLED display includes an array of light emitting OLED pixels, each pixel having three or more gamut elements for emitting different colors of light specifying a gamut and at least one additional element for emitting a color of light within the gamut and wherein the power efficiency of the additional element is higher than the power efficiency of at least one of the three or more gamut elements; wherein all of the gamut elements for each color in the display are arranged in a first direction in a line such that no differently colored gamut element is in the line; wherein the colored gamut elements are arranged in a second direction orthogonal to the first direction in a line such that the colors of the gamut elements alternate in that line; and wherein the additional elements are arranged in lines in both the first and second directions.

24 Claims, 13 Drawing Sheets

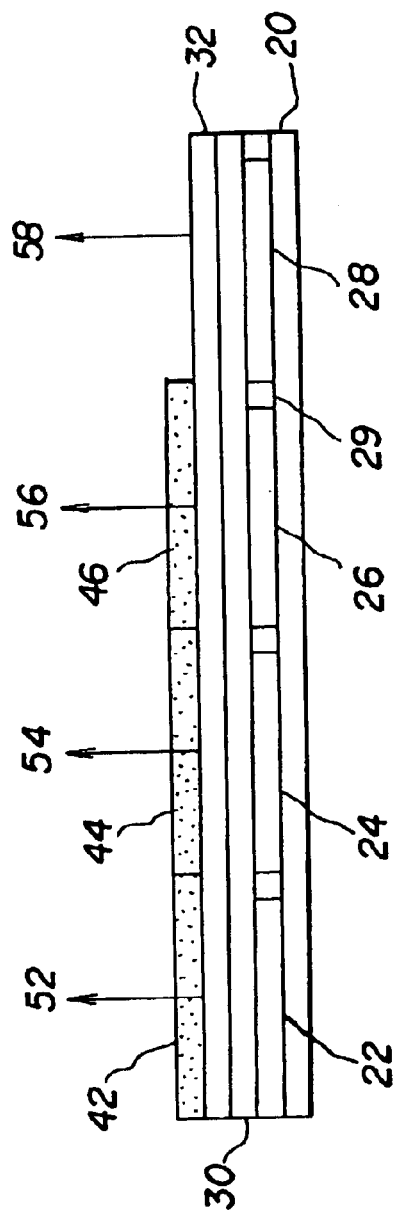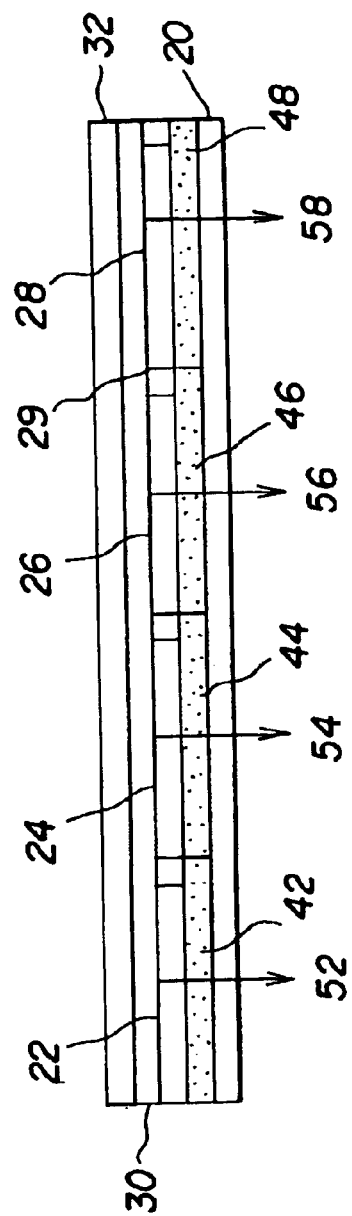

COLOR OLED DISPLAY WITH IMPROVED POWER EFFICIENCY

FIELD OF THE INVENTION

The present invention relates to OLED color displays and, more particularly, to arrangements of light emitting elements in such OLED color displays.

BACKGROUND OF THE INVENTION

U.S. Patent Application No. 2002/0186214A1 by Siwinski et al., published Dec. 12, 2002, shows a method for saving power in an organic light emitting diode (OLED) display having pixels comprised of red, green, blue and white light emitting elements. The white light emitting elements are more efficient than the other colored light emitting elements and are employed to reduce the power requirements of the display.

While power efficiency is always desirable, it is particularly desirable in portable applications because an inefficient display limits the time the device can be used before the power source is recharged. In fact, for certain applications the rate of power consumption may be more important than any other display characteristic with the exception of visibility. Referring to FIG. 2, an arrangement of four pixels 10 having red 12, green 14, blue 16 and white 18 light emitting elements as taught by Siwinski is shown. The light emitting elements in each pixel are arranged in a two by two array.

Widely used text rendering software such as Microsoft ClearType™ relies upon displays in which the colored elements of the display are arranged to form vertical stripes. Such arrangements are known in LCD displays that have pixels comprised of red, green, and blue light emitting elements. An example of such an arrangement is shown in FIG. 3, however this arrangement does not provide the power savings of the display device taught by Siwinski.

There is a need, therefore, for an improved full-color flat-panel OLED display having improved power efficiency while maintaining full-color reproduction and compatibility with a stripe-pattern arrangement.

SUMMARY OF THE INVENTION

The need is met by providing a color OLED display that includes an array of light emitting OLED pixels, each pixel having three or more gamut elements for emitting different colors of light specifying a gamut and at least one additional element for emitting a color of light within the gamut and wherein the power efficiency of the additional element is higher than the power efficiency of at least one of the three or more gamut elements; wherein all of the gamut elements for each color in the display are arranged in a first direction in a line such that no differently colored gamut element is in the line; wherein the colored gamut elements are arranged in a second direction orthogonal to the first direction in a line such that the colors of the gamut elements alternate in that line; and wherein the additional elements are arranged in lines in both the first and second directions.

ADVANTAGES

The advantages of this invention are a color display device with improved power efficiency and compatibility with stripe pattern arrangements.

BRIEF DESCRIPTION OF THE DRAWINGS

FIG. 4 is a side view of a portion of a top-emitting OLED display according to one embodiment of the present invention;

FIG. 5 is a side view of a portion of a bottom-emitting OLED display according to one embodiment of the present invention;

DETAILED DESCRIPTION OF THE INVENTION

Figure 1:
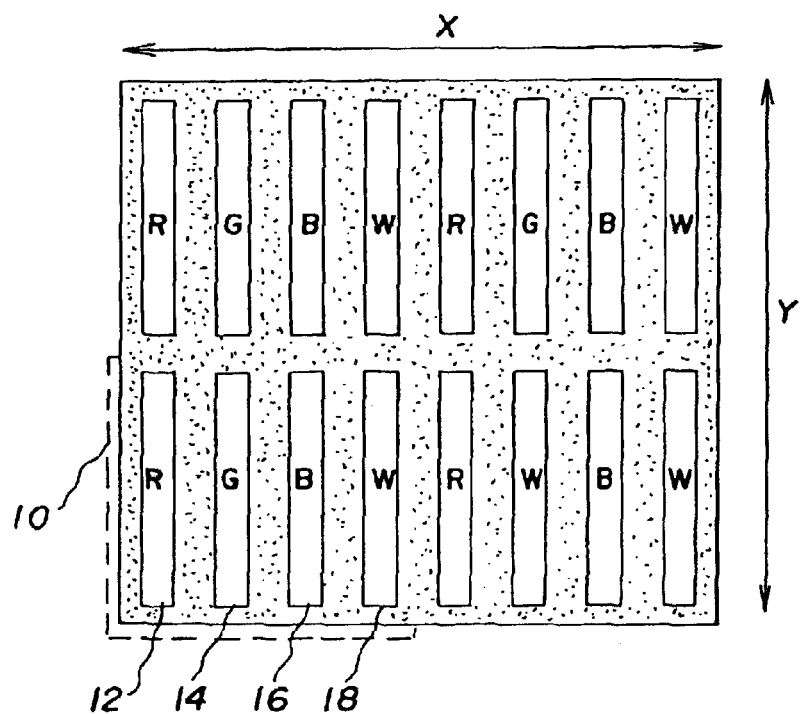
FIG. 1 is a schematic diagram of a portion of an OLED display having light emitting elements arranged according to one embodiment of the present invention.
Figure 2:
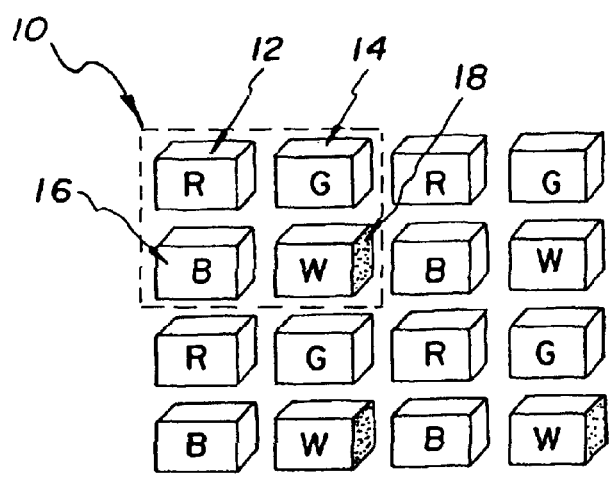
FIG. 2 is a schematic diagram of a portion of an OLED display having light emitting elements arranged according to the prior art.
Figure 3:
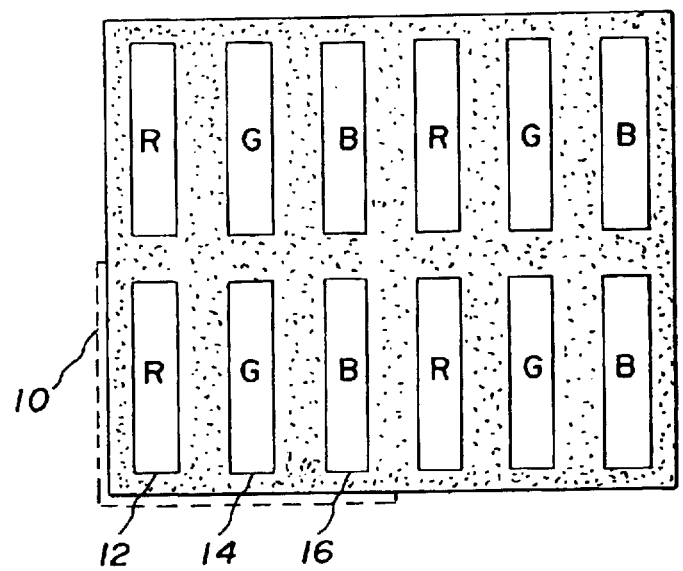
FIG. 3 is a schematic diagram of a portion of an OLED display having light emitting elements arranged according to the prior art.

Referring to FIG. 1, an OLED display according to the present invention includes an array of light emitting OLED pixels 10, each pixel having three or more gamut elements such as red 12, green 14, blue 16 light emitting elements for emitting different colors of light specifying a gamut and at least one additional element such as white light emitting element 18 for emitting a color of light within the gamut. The power efficiency of the additional element is higher than the power efficiency of the gamut elements so that by driving the additional element in place of the gamut elements, the power consumption of the display may reduced. All of the gamut elements for each color in the display are arranged in a first direction Y in a line such that no differently colored gamut element is in the line. The colored gamut elements are arranged in a second direction X orthogonal to the first direction in a line such that the colors of the gamut elements alternate in that line. This arrangement of light emitting elements is compatible with text rendering software that requires stripe-pattern displays. The light emitting elements in the pixels are all individually addressable using conventional means.

According to the present invention, luminance that would conventionally be produced by a combination of lower power efficiency gamut elements can instead be produced by the higher power efficiency additional elements. Thus, any color that can be reproduced using the additional elements will be more efficient than an equivalent reproduction using the gamut elements. A suitable transformation function may be provided by a signal processor that converts a standard color image signal to a power saving image signal that is employed to drive the display of the present invention.

The present invention can be employed in most OLED device configurations that include four or more OLEDs per pixel. These include very unsophisticated structures comprising a separate anode and cathode per OLED to more sophisticated devices, such as passive matrix displays having orthogonal arrays of anodes and cathodes to form pixels, and active-matrix displays where each pixel is controlled independently, for example, with a thin film transistor (TFT).

Referring to FIG. 4, a top-emitting OLED display having a plurality of light emitting elements includes a single layer of white light emitting material 30 formed on a substrate 20. A plurality of electrodes 22, 24, 26, and 28 separated by insulators 29 define the light emitting elements 12, 14, 16 and 18 (see FIG. 1). A second transparent electrode 32 is formed on the white-light emitting organic material 30. Red 42, green 44, blue 46 color filters are provided over the electrodes 22, 24, and 26 respectively so that when white light is emitted from the organic layer 30, red light 52 is emitted above electrode 22, green light 54 is above electrode 24, and blue light 56 is above electrode 26. Unfiltered, white light 58 is emitted above electrode 28. A transparent encapsulating cover (not shown) is provided over the device. Alternative arrangements of the electrodes 22–28 and color filters 42–46 may be provided as described below. Moreover, an additional filter (not shown) may be supplied above the white emitter to adjust the white point of the light emitted from the additional light emitting elements.

Referring to FIG. 5, in a bottom-emitting arrangement, light is emitted through the substrate 20. In this arrangement, the second electrode 32 need not be transparent while the first electrodes 22, 24, 26, and 28 are transparent. The color filters 42, 44, 46, and a white point adjusting filter 48 are formed on the substrate 20 prior to forming the light emitting elements.

The present invention provides compatibility with color stripe patterns preferred for rendering text. In the simplest arrangement, as shown in FIG. 1, an additional white element is provided in sequence after the gamut elements. Referring to FIG. 1, a series of columns of each color are composed of pixels 10 having color light emitting elements red 12, green 14, blue 16, and white 18. In the vertical direction, the elements form a single colored striped line. In an orthogonal, horizontal direction, the colored lines alternate sequentially. It should be noted that the light emitting element arrangements shown in the embodiment described in FIG. 1 and in the embodiments described below can be reflected or rotated without changing their properties.

In the arrangement shown in FIG. 1, the additional white light emitting elements 18 are arranged to alternate with the green light emitting elements 14 so that the white and green elements are spatially symmetric, which may enhance the luminance resolution of the display since white and green both carry a relatively large amount of luminance information in a display.

Figure 6:
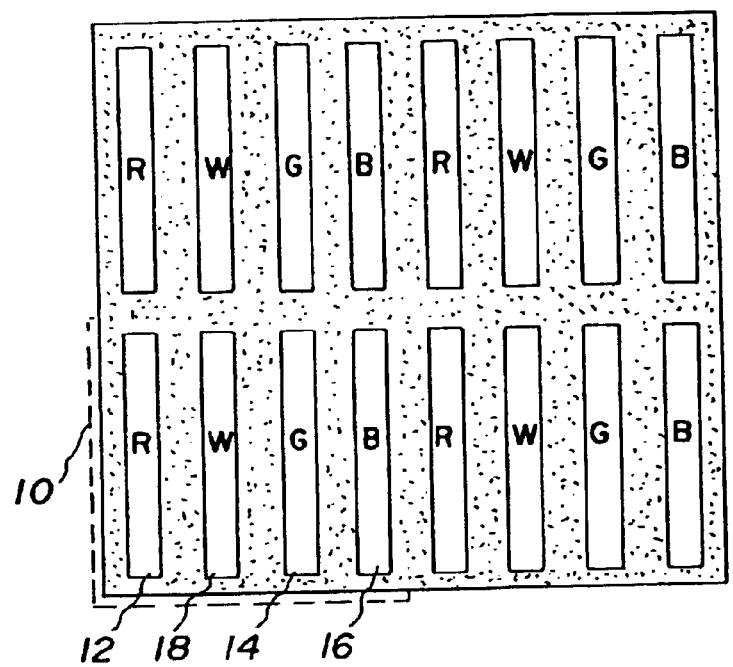
FIG. 6 is a schematic diagram of a portion of an OLED display having light emitting elements arranged according to an alternative embodiment of the present invention.

Referring to FIG. 6, in a slightly different arrangement, the white and green elements 18 and 14 are arranged between the red and blue elements 12 and 16. The white element 18 may also be placed between the green 14 and blue 16 elements (not shown). These two configurations have the advantage of positioning the additional white element more centrally within the pixel. Since white light is a combination of colors, positioning the white light element in a central position within the pixel may provide a viewer with an experience more consistent with the experience from a conventional stripe pattern.

Figure 7:
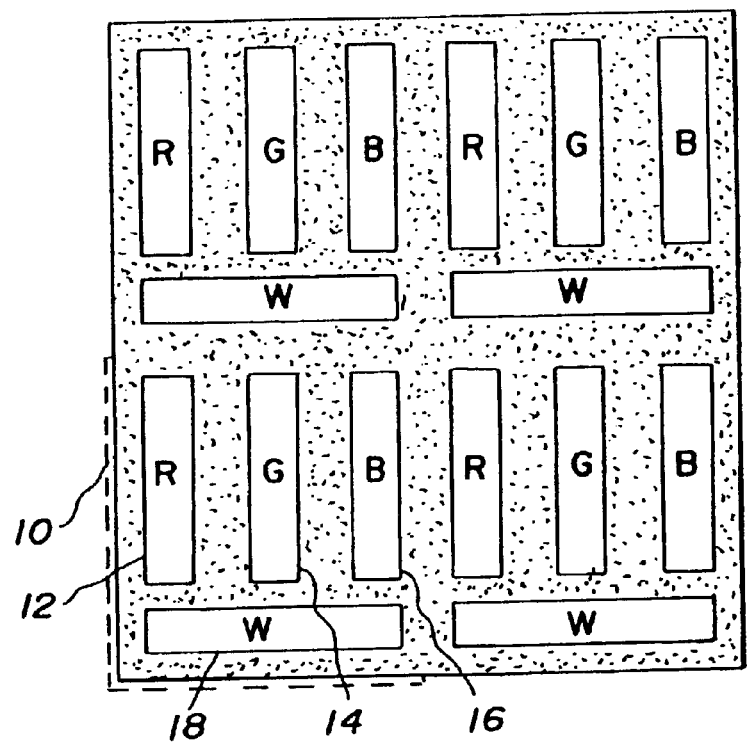
FIG. 7 is a schematic diagram of a portion of an OLED display having light emitting elements arranged according to another alternative embodiment of the present invention.

Referring to FIG. 7, in an alternative embodiment, the additional element 18 may be arranged with respect to the gamut elements to spatially integrate the light from the pixel 10. For example, the additional element 18 may be located beneath (or above) the gamut elements. Since the additional (in-gamut) element emits light that would otherwise be emitted from gamut elements, locating the additional element 18 such that its light emission is located near all the gamut elements will provide compatibility with a stripe arrangement and form a spatially integrated light source.

Figure 11:
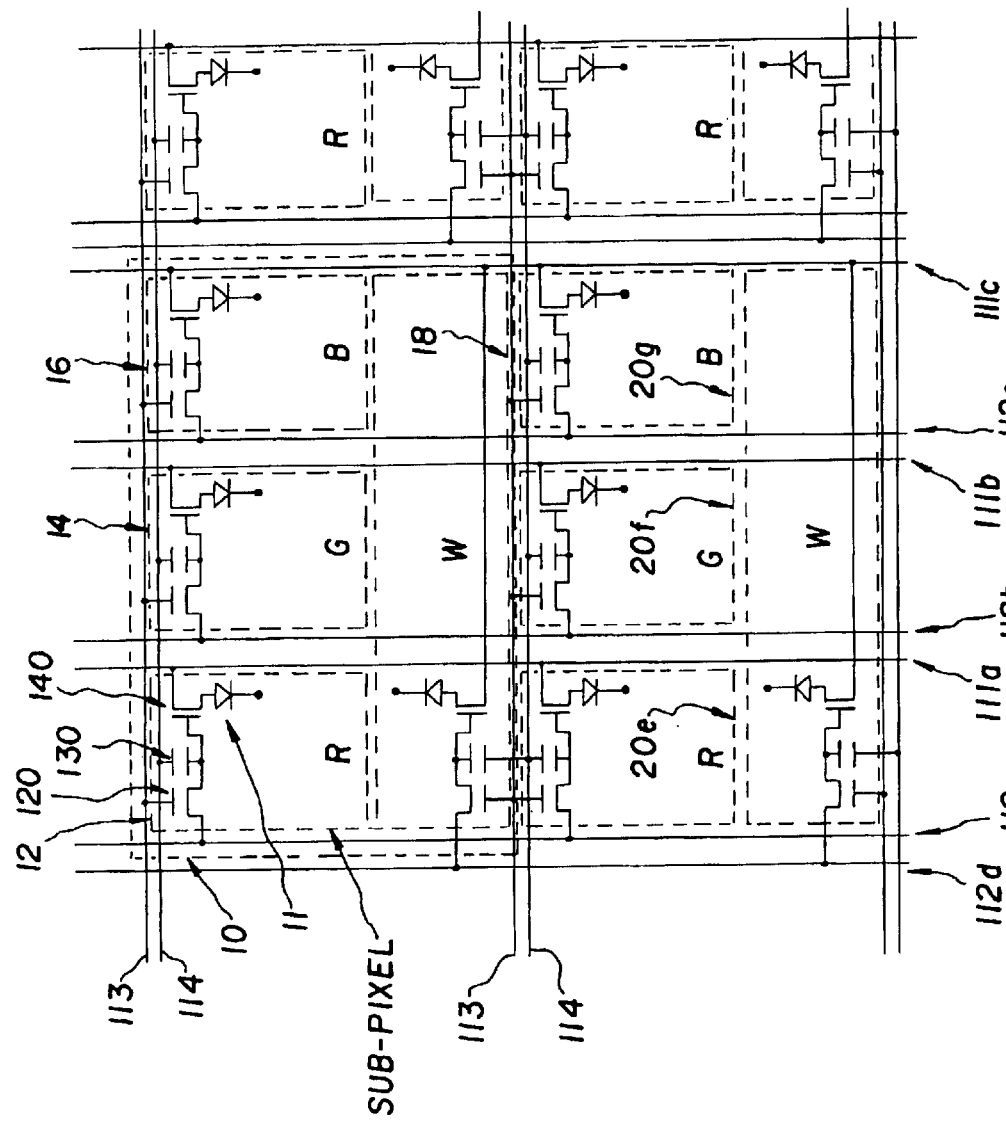
FIG. 11 is a circuit layout diagram of a portion of the pixel area of an OLED display of the type shown in FIG. 7.

Referring to FIG. 11, a circuit pattern diagram for an active matrix display of the type shown in FIG. 7 is shown. The light emitting elements are connected to select lines 113, data lines 112a or 112b or 112c or 112d, power lines 111a, 111b or 111c, and capacitor lines 114. To operate the display, rows of light emitting elements are selected by applying a voltage to a single select line, which turns on the select transistors 120 of the connected light emitting elements. The brightness level for each light emitting element is controlled by a voltage signal, which is held on the data lines. The storage capacitor 130 of each selected element is then charged to the voltage level of the associated data line 112a, 112b, 112c or 112d. Within each light emitting element, the storage capacitor is connected to the gate of the power transistor 140 so that the voltage level held on the storage capacitor regulates the current flow through the power transistor 140 to the light emitting elements' organic EL element 11 and thereby brightness is controlled. Each row is then un-selected by applying a voltage signal to the select line 113 which turns off the select transistor 120. The data line 112 voltages are then set to the levels desired for the next row and the select line of the next row is turned on. This is repeated for every row of light emitting elements. The storage capacitors 130 maintain the data voltage until the row is selected again during the next image frame.

The power lines are typically connected to a common voltage level for all light emitting elements. As shown here, the light emitting elements 12, 14, and 16 are connected to a different select line than light emitting element 18. This means that the brightness level of light emitting element 18 is written at a different time than that of light emitting elements 12, 14, and 16. However, an alternate configuration where a pixel is defined as being composed of light emitting elements 18, 12a, 14a, and 16a, would result in the brightness level of all light emitting elements within the pixel being adjusted simultaneously and is understood to be within the scope of the invention.

Figure 12:
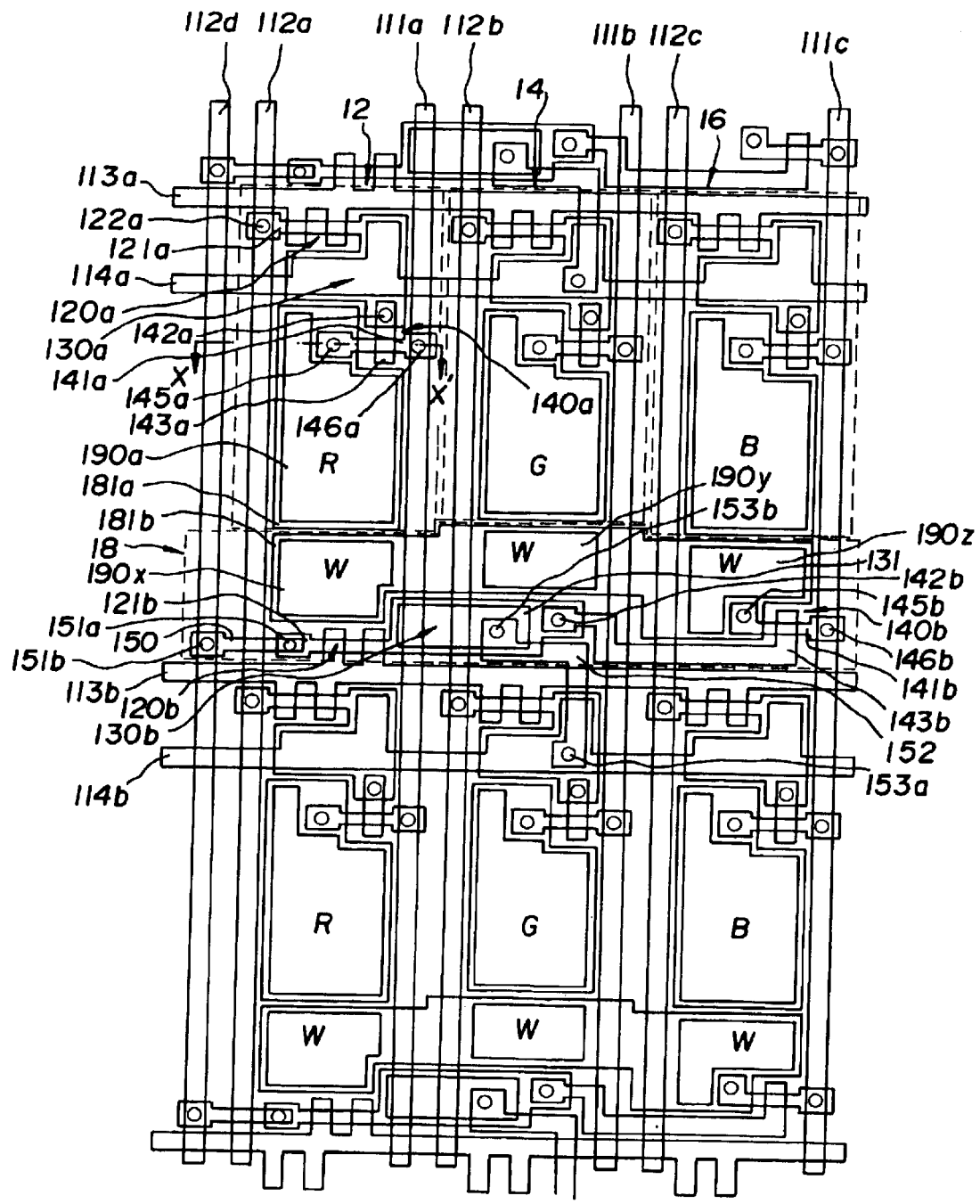
FIG. 12 is a detailed layout diagram of a portion of the pixel area of an OLED display shown in FIG. 11.

FIG. 12 shows a layout pattern diagram for the active matrix circuit of FIG. 11 as described above. The drive circuitry components are fabricated using conventional integrated circuit technologies. Light emitting element 12, for example, consists of a select transistor 120*a* formed from a first semiconductor region 121*a* using techniques well known in the art. Similarly, a power transistor 140*a* is formed in a second semiconductor region 141*a*. The first semiconductor region 121*a* and second semiconductor region 141*a* are typically formed in the same semiconductor layer.

This semiconductor layer is typically silicon which may be amorphous, polycrystalline, or crystalline. This first semiconductor region 121*a* also forms one side of the storage capacitor 130*a*. Over the first semiconductor region 121*a* and second semiconductor region 141*a* is an insulating layer (not shown) that forms the gate insulator of the select transistor 120*a*, the gate insulator for power transistor 140*a*, and the insulating layer of the storage capacitor 130*a*. The gate of the select transistor 120*a* is formed from part of the select line 113*a* which is formed in the first conductive layer.

The power transistor 140*a* has a separate gate conductor 143*a* also preferably formed in the first conductive layer. The other electrode of the storage capacitor 130*a* is formed as part of capacitor line 114*a*, also preferably from the first conductive layer. The power line 111*a* and the data lines 112*a* respectively, are preferably formed in a second conductive layer. One or more of the signal lines (e.g. select line 113*a*) frequently cross at least one or more of the other signal lines (e.g. data line 112*a*), which requires these lines to be fabricated from multiple conductive layers with at least one interlayer insulating layer (not shown). The organic EL element is formed by patterning a first electrode 181*a* for each pixel as well as depositing one or more layers of organic EL media (not shown) and a second electrode (not shown).

Connections between layers are formed by etching holes (or vias) in the insulating layers such as the first via 122*a* connecting data line 112*a*, to the first semiconductor region 121*a* of the select transistor, the second via 142*a* connecting the power transistor gate conductor 143*a* to first semiconductor region 121*a* of the storage capacitor 130*a* and the select transistor 120*a*, the third via 146*a* connecting the second semiconductor region 141*a* of the power transistor to power line 111*a*, and the fourth via 145*a* connecting the second semiconductor region 141*a* of the power transistor to the first electrode 181*a*.

Over the first electrode, an inter-element insulating film is formed to reduce shorts between the anode and the cathode. Use of such insulating films over the first electrode is disclosed in U.S. Pat. No. 6,246,179 issued Jun. 12, 2001 to Yamada. The inter-element insulating film is coated over all the light emitting elements of the display and openings are made to allow the first electrodes to connect to the OLED layers (not shown). For light emitting element 12, opening 191*a* is formed in the inter-pixel dielectric over the first electrode 181*a*. Opening 191*a* defines the area of the light emitting element which will emit light. While use of the inter-element insulating film is preferred, it is not required for successful implementation of the invention.

Light emitting elements 14 and 16 are formed similarly to light emitting element 12 and are connected to data lines 112*b* and 112*c* respectively as well as to power lines 111*b* and 112*c* respectively.

Light emitting element 18 is connected to select line 113*b*, capacitor line 114*b*, data line 112*d*, and power line 111*c*. Light emitting element 18 can alternately be connected to power line 111*b* or 111*a* or be provided a unique power line not shared by light emitting elements having other colors by someone skilled in the art. Like light emitting element 12, light emitting element 18 consists of a select transistor 120*b*, a storage capacitor 130*b*, and power transistor 140*b*. The select transistor and capacitor are constructed with a first semiconductor region 121*b*. The power transistor is constructed with a second semiconductor region 141*b* and a gate electrode 143*b* connected to the first semiconductor region by via 142*b*, to power line 111*c* by via 146*b*, and to the first electrode 181*b* by via 145*b*.

For light emitting element 18, in order to connect the first semiconductor region 121*b* to data line 112*d*, data line 112*a* must be crossed. This is done using first conductive bridge 150 which is preferably constructed of the first conductive layer. The conductive bridge is connected to data line 112*d* by via 151*b* and to the first semiconductor region by via 151*a*. While use of first conductive bridge 150 is preferred, it is not required, and other connection methods including connecting the first semiconductor region 121*b* directly to data line 112*d* can be achieved by someone skilled in the art. Furthermore, depending on how the data lines are arranged, the conductive bridge maybe applied to a light emitting element other than light emitting element 18. For example, if the locations of data line 112*a* and data line 112*d* were reversed, then the conductive bridge may be applied to light emitting element 12 instead of light emitting element 18. Furthermore, more than one conductive bridge may be used to pass data lines on more than one light emitting element.

Light emitting element 18 also preferably uses a second conductive bridge 152 to connect the second capacitor electrode 131 to the capacitor line 114*b* bridging over the select line 113*b*. The second conductive bridge 152 is preferably constructed in the second conductive layer. The second conductive bridge 152 connects to the second capacitor electrode 131 by via 153*b* and to capacitor line 114*b* by via 153*a*. As with the first conductive bridge 150, by rearranging the components and connection lines, the second conductive bridge may be located on a light emitting element (or more than one light emitting element) other than light emitting element 18. Variations of the light emitting elements can be constructed without a second conductive bridge if the select lines and capacitor lines are fabricated of different conductive layers.

The first electrode 181*b* of light emitting element 18 stretches across several signal lines such as power lines 111*a* and 111*b* as well as data lines 112*b* and 112*c*. These regions are not emitting in a bottom emission configuration and may be covered with inter-pixel dielectric. This results in three separate openings in the inter-element dielectric 191*x*, 191*y*, and 191*z* which results in three separate emitting regions for light emitting element 18.

The light emitting elements of the present invention have been shown and have been described as configured in a bottom-emission configuration. If the device were to be configured in a top-emission configuration, the first electrodes can be increased in size and made to extend over the other various circuit components and signal lines. The openings in the inter-pixel dielectric can be increased in a similar fashion. In this case, the light emitting element 18 would not need to be provided multiple separate openings, and thereby multiple separate emitting regions, but could instead be provided one larger continuous opening and emitting region. Such a configuration is envisioned as being consistent with the present invention.

While the above embodiments have been described with reference to a specific configuration of the active matrix circuit, several variations of the conventional circuit which are known in the art can also be applied to the present invention by someone skilled in the art. For example, one variation such as that shown in U.S. Pat. No. 5,550,066 issued Aug. 27, 1996 to Tang et al. does not have a separate capacitor line but instead connects the capacitors directly to the power line. A second variation as shown in U.S. Pat. No. 6,476,419 issued Nov. 5, 2002 to Yasuda uses two capacitors disposed directly over each other where the first capacitor is fabricated between the semiconductor layer and the gate conductor layer and the second capacitor is fabricated between the gate conductor layer and the second conductor layer. Either of these variations can be applied to the present invention by someone skilled in the art.

While the circuit requires a select transistor and a power transistor for each light emitting element, several variations of these transistor designs are known in the art. For example, single and multi-gate versions of transistors are known and have been applied to the select transistors in prior art. A single gate transistor contains a gate, a source and a drain. An example of the use of a single gate type of transistor for the select transistor is shown in U.S. Pat. No. 6,429,599 issued Aug. 6, 2002 to Yokoyama. A double transistor contains at least two gates electrically connected together and therefore a source, a drain, and at least one intermediate source-drain between the gates. An example of the use of a multi-gate type of transistor for the select transistor is shown in U.S. Pat. No. 6,476,419, referenced above. This type of transistor can be represented in a circuit schematic by a single transistor or two or more transistors in series which have their gates connected and the source of one transistor connected directly to the drain of the second transistor. While the performance of these transistor designs may differ, both types of transistors serve the same function in the circuit and either type can be applied to the present invention by someone skilled in the art. The example of the preferred embodiment of the present invention is shown with a multi-gate type select transistor 120 represented by a single transistor symbol.

Also known in the art is the use of multiple parallel transistors to which is typically applied the power transistor 140. Multiple parallel transistors are described in U.S. Pat. No. 6,501,448 issued Dec. 31, 2002 to Komiya et al. Multiple parallel transistors consist of two or more transistors with their sources, drains, and gates all electrically connected together. However, the location of the multiple transistors are separated in location within the pixels providing multiple parallel paths for current flow. The use of multiple parallel transistors has the advantage of providing robustness against variability and defects in the semiconductor layer manufacturing process. While the power transistor described in the embodiments of the present invention are shown as a single transistor, this can be replaced by multiple parallel transistors by someone skilled in the art and are therefore understood to be within the spirit of the invention.

Alternate circuit types are also known in the art such as constant current source driving schemes. An example of a constant current source device is provided in U.S. Pat. No. 6,501,466 issued Dec. 31, 2002 to Yamagishi et al. Alternate circuit types can be applied to the present invention by someone skilled in the art.

Figure 13:
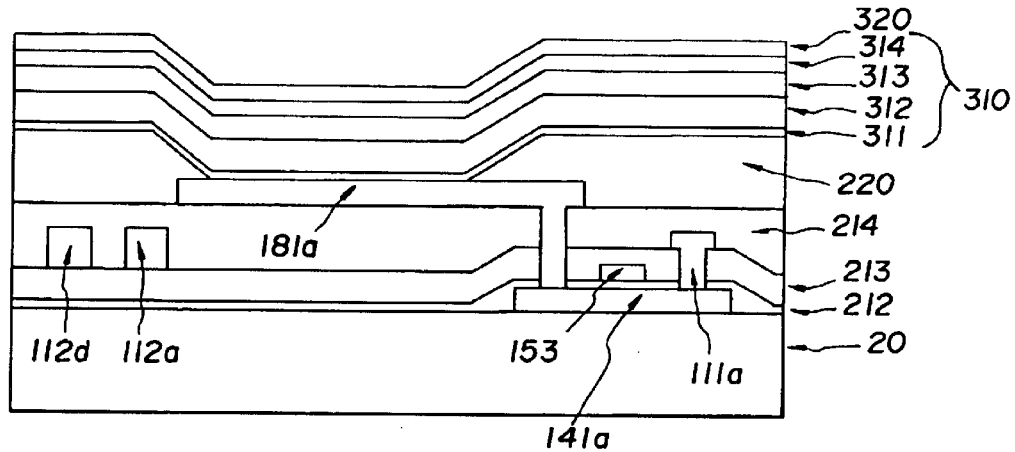
FIG. 13 is a cross sectional diagram of one light emitting element in an OLED display.

Turning now to FIG. 13, the vertical arrangement of the various layers from FIG. 12 are shown. The drive circuitry is disposed over substrate 20 and under OLED layer 310 in a manner herein described. Layer 310 includes a hole injecting layer 311, a hole transporting layer 312, a light emitting layer 313, and an electron transporting layer 314. Over the substrate 20, a semiconductor layer is formed, doped, and patterned creating the second semiconductor region 141a. A gate insulating layer 212 is formed over the semiconductor layer. Over the gate insulating layer 212, a gate conductor is formed in the first conductor layer. The semiconductor layer is then doped to form source and drain regions on either sides of the gate conductor 143a. A first interlayer insulator layer 213 is formed over the gate conductor 143a. Over the first interlayer insulator layer 213, a second conductor layer is deposited and patterned forming the first power lines (e.g. 111a) and the data lines (e.g. 112a and 112d). A second interlayer insulator layer 214 is formed over the power and data lines (e.g. 111a, 112a, etc.). The first electrode 181a is formed over the second interlayer insulator layer 214. The first electrode 181a is patterned. Around the edges of the first electrode 181a, an inter element dielectric film 220 is formed to reduce shorts between the first electrode 181a and the second electrode 320.

Figure 14:
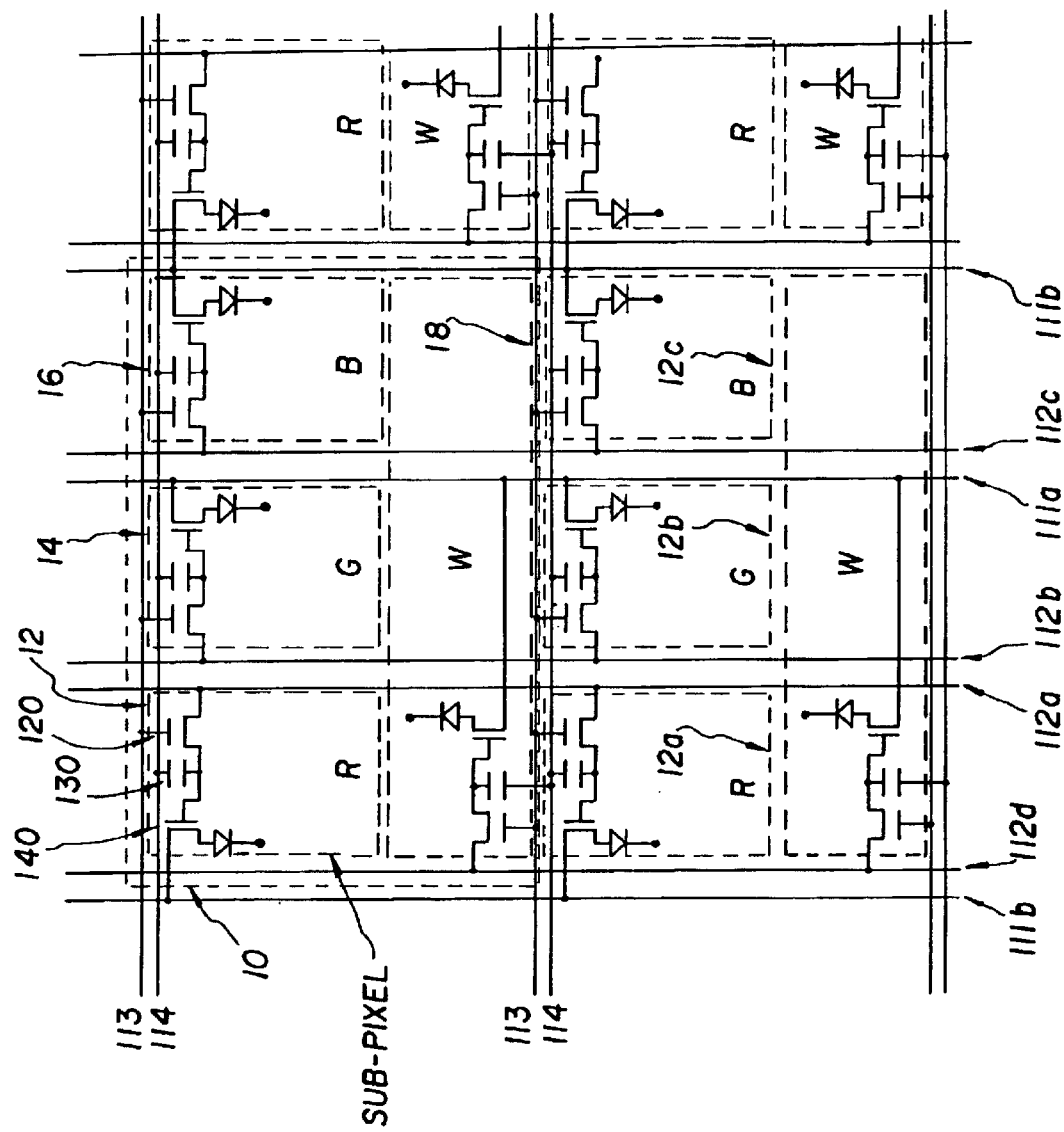
FIG. 14 is an alternative circuit layout diagram of a portion of the pixel area of an OLED display of the type shown in FIG. 7.

Referring to FIG. 14, an alternate arrangement of the drive circuitry is shown. In FIG. 14, the arrangement of the data lines and power lines has been configured such that there are two power lines 111a and 111b per pixel in a row. In this example, light emitting elements 14 and 18 share power line 111a. Light emitting element 16 shares a power line 111b with a light emitting element from an adjacent pixel. That is, light emitting element 14 is connected to a power line 111b of a adjacent pixel. This arrangement has fewer power lines per pixel than the arrangement in FIG. 11 and each power line carries the current load from two light emitting elements.

Figure 15:
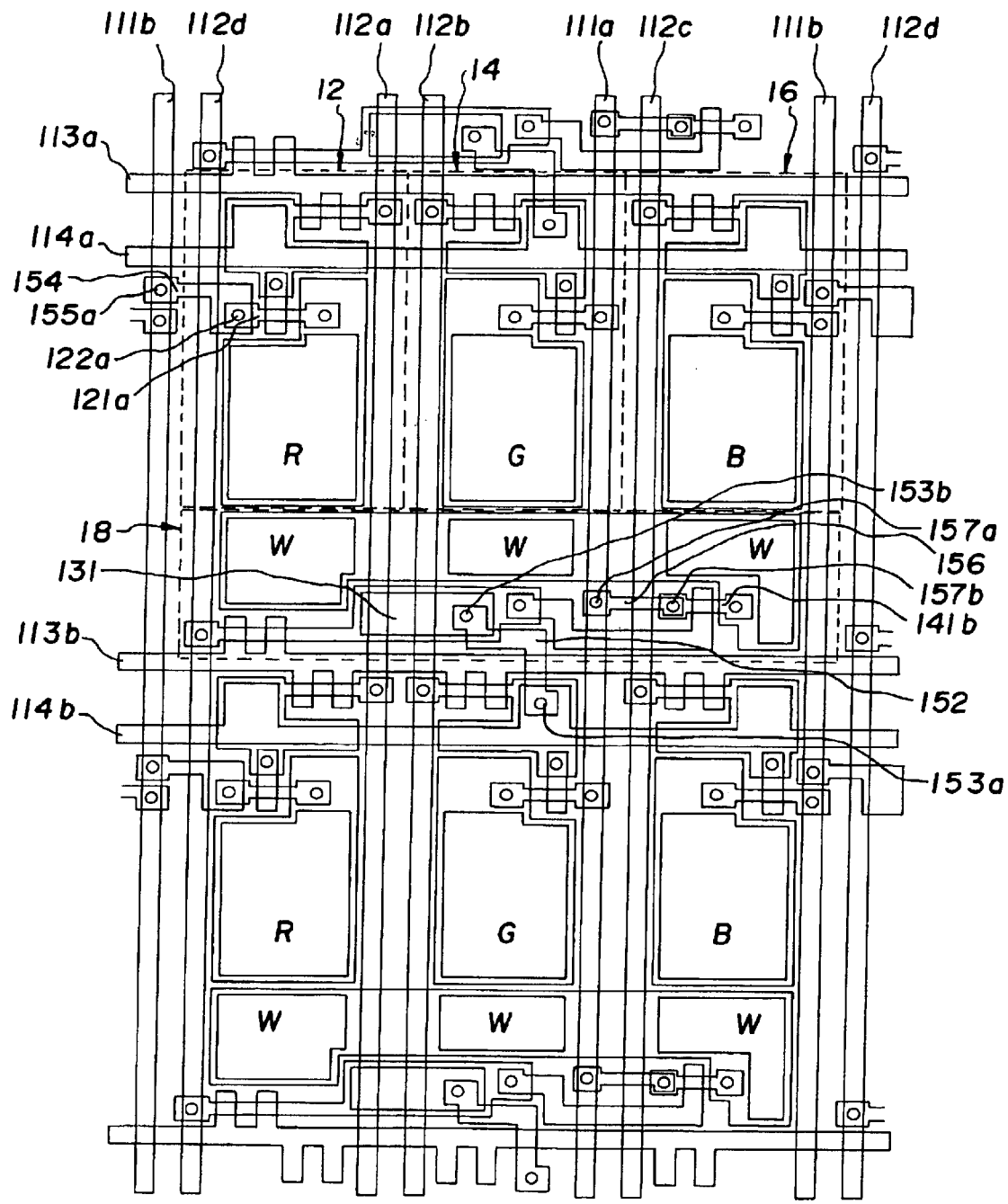
FIG. 15 is a more detailed layout diagram of a portion of the pixel area of an OLED display shown in FIG. 14.

FIG. 15 shows a layout pattern diagram for the active matrix circuit of FIG. 14 as described above. This pattern has the same transistor and capacitor components as described in FIG. 12. In order to achieve the desired two power lines per pixel, several conductive bridge structures are utilized as described above. The first conductive bridge 154 is connected to the first semiconductor region 121a of light emitting element 12 by via 155a and to a power line 111b by via 155b bridging over data line 112d. The second conductive bridge 152 connects the second capacitor electrode 131 of light emitting element 18 to the capacitor line 114b bridging over the select line 113b. The third conductive bridge 156 connects to the second semiconductor region 141b of light emitting element 18 by via 157b and to power line 111a by via 157a.

While these conductive bridges are shown as part of particular light emitting elements, they may be located on other light emitting elements other than those shown. While use of the conductive bridges is preferred, they are not required to successfully practice the present invention.

Figure 16:
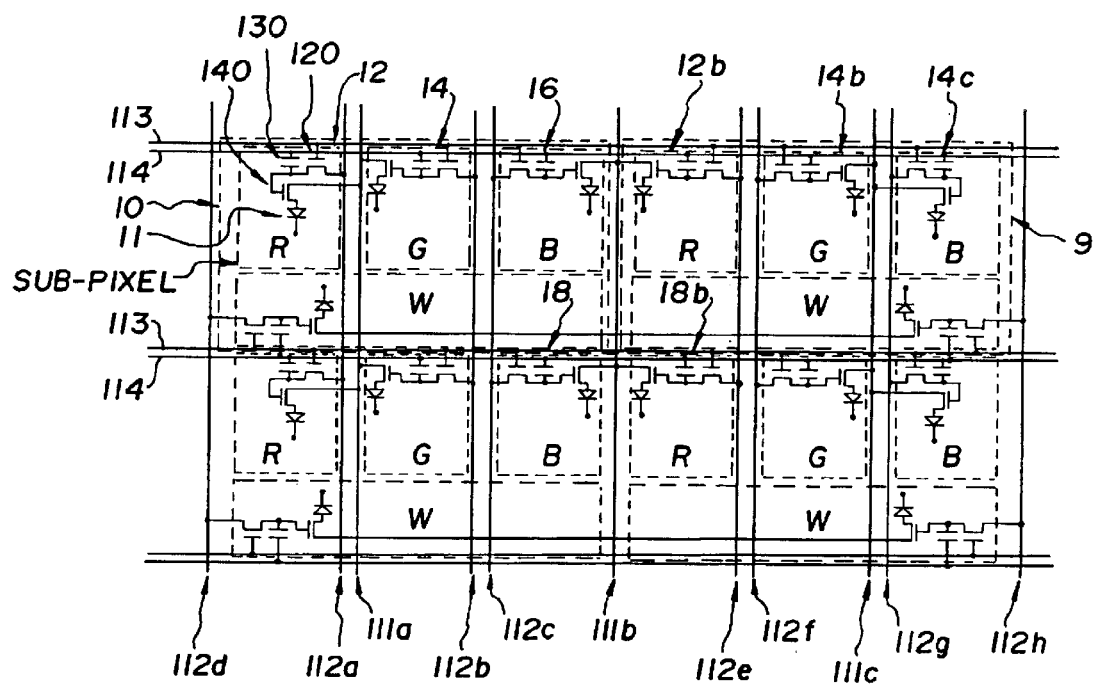
FIG. 16 is another alternative circuit layout diagram of a portion of the pixel area of an OLED display of the type shown in FIG. 7.

Referring now to FIG. 16, an alternate arrangement of the pixel circuit of the first embodiment is shown. In FIG. 16, the arrangement of the data lines and power lines for two adjacent pixels 10 and 9 have been configured such that there are three power lines 111a, 111b, and 111c for every two pixels in a row. In this example, light emitting elements 16, 18, 12b, and 18b are all connected to power line 111b. This arrangement has fewer power lines per pixel than the arrangements in FIG. 11 and FIG. 14.

Figure 17:
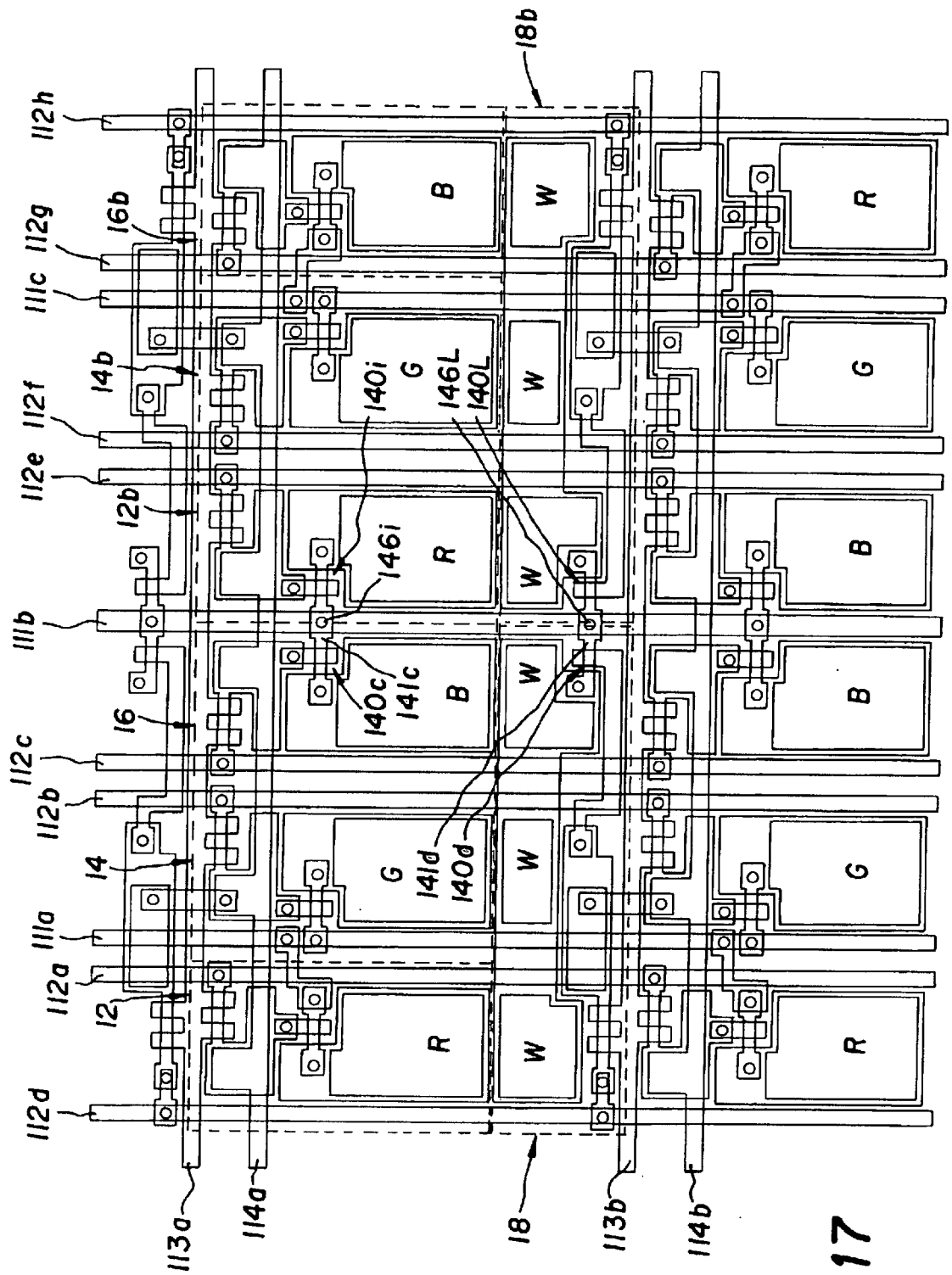
FIG. 17 is a more detailed layout diagram of a portion of the pixel area of an OLED display shown in FIG. 16.

FIG. 17 shows a layout pattern diagram for the active matrix circuit of FIG. 16 as described above. This pattern has the same transistor and capacitor components as described in the FIG. 12. In order to achieve the desired three power lines per two pixels, the layout of light emitting elements 12b, 14b, 16b, and 18b are reversed with respect to light emitting elements 12, 14, 16, and 18. The power transistor 140c of light emitting element 16 and the power transistor 140i of light emitting element 12b are both connected to power line 111b. Therefore these transistors can be formed from the same semiconductor region 141c and contact can be made between the semiconductor region 141c and the power line 111b using the same via 146i. Similarly, the power transistor 140d of light emitting element 18 and the power transistor 140L of light emitting element 18b are both connected to power line 111b. Therefore these transistors can be formed from the same semiconductor region 141d and contact can be made between the semiconductor region 141d and the power line 111b using the same via 146L. While using the same via and semiconductor region for the above-mentioned transistors is desirable, it is not required to successfully practice the invention.

Figure 8:
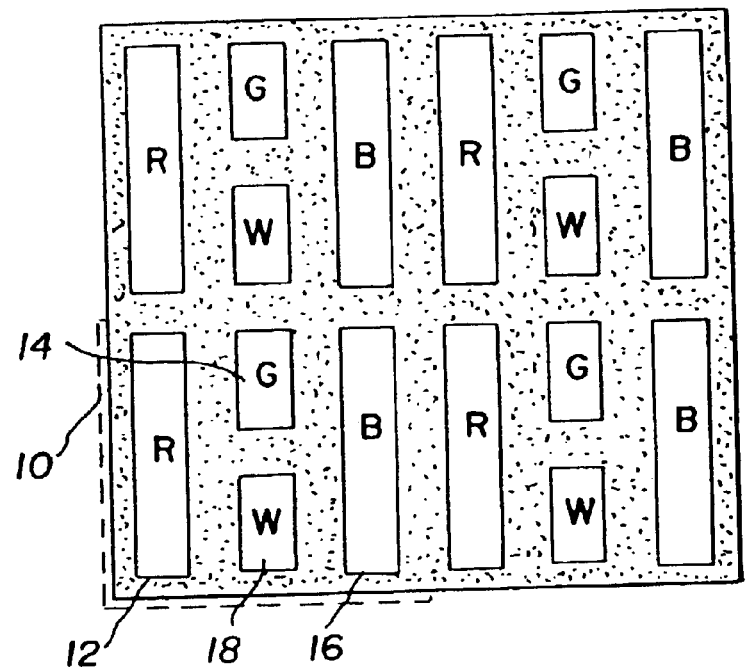
FIG. 8 is a schematic diagram of a portion of an OLED display having light emitting elements arranged according to another alternative embodiment of the present invention.

Referring to FIG. 8, in an alternative embodiment, the white element 18 is arranged near the center of the pixel 10. Each pixel 10 includes the red 12, green 14, and blue 16 elements as conventionally arranged except that the center element 14 is smaller. The additional element 18 is located below (or above) the center element. Since a white element effectively emits light that would otherwise be emitted from all three color elements, locating the white element 18 such that the white light emission is located near the center of all three color elements will provide compatibility with a stripe arrangement.

Figure 18:
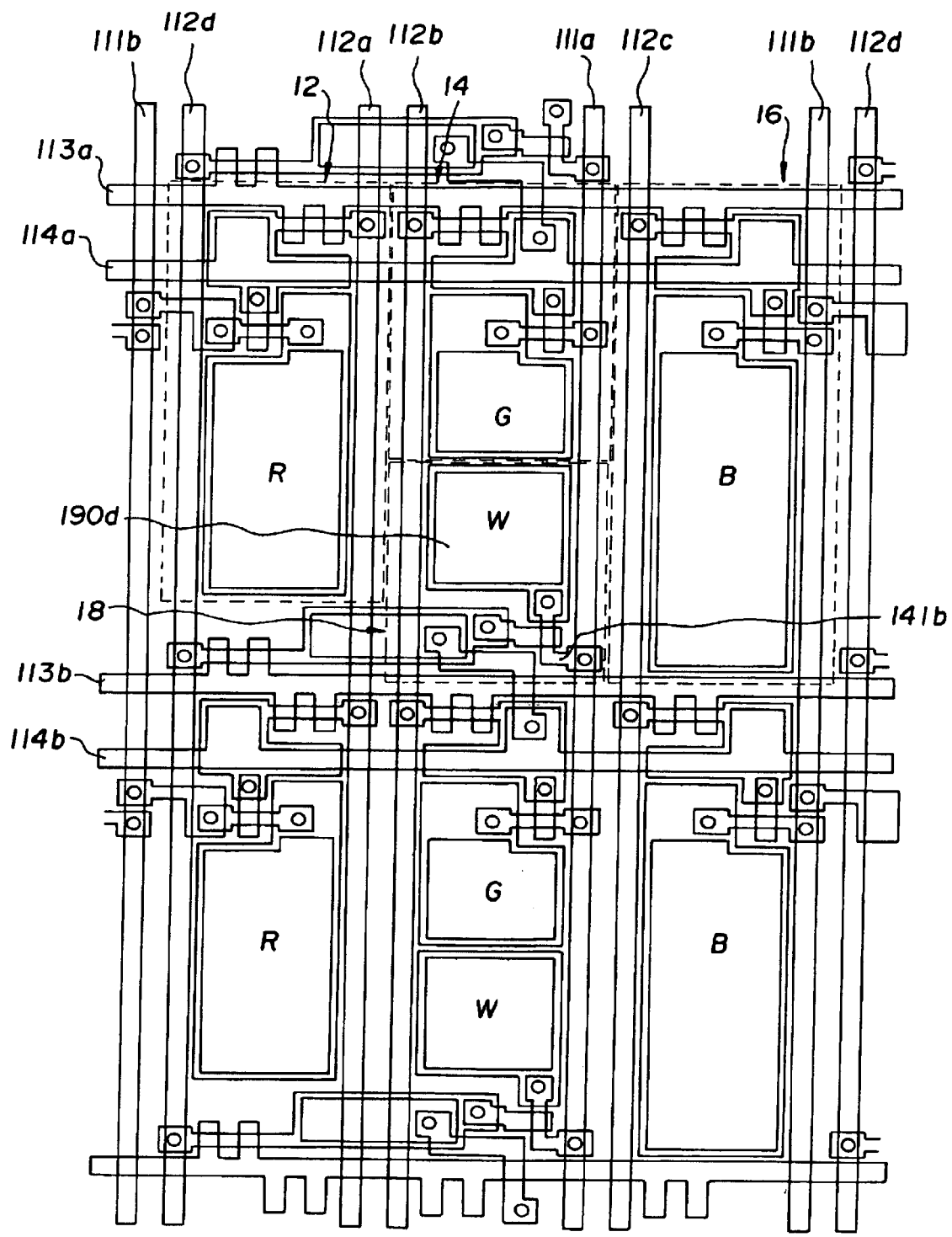
FIG. 18 is another alternative layout diagram of a portion of the pixel area of an OLED display of the type shown in FIG. 8.

Referring to FIG. 18, a layout pattern is shown where the white light emitting element 18 and the green light emitting element 14 are aligned into a single stripe as illustrated in FIG. 8. Any of the circuit layout examples described above can be made to drive this arrangement. The example shown in FIG. 18 shows a system with two power lines per pixel in a row. When arranged such that light emitting elements 14 and 18 form a stripe, only a single opening 190d in the inter-element dielectric layer is required for light emitting element 18.

The display is capable of presenting all of the colors presented by a standard three color, red, green, blue OLED display device. The color of the white OLED 18 may be designed to match the white point of the display. In this embodiment, the signal processor used to drive the display is configured to allow any gray value, including white, which would typically be presented using a combination of the red 12, green 14, and blue 16 color OLEDs to be created using primarily the white OLED 18. To achieve this, the peak luminance of the white OLED 18 is designed to match the combined luminance of the red 12, green 14, and blue 16 OLEDs. That is, in a typical configuration where the prior art display would be designed to achieve a peak luminance of 100 cd/sq. m, the red 12, green 14, and blue 16 OLEDs will be set up to produce this peak luminance when they are all turned on to their maximum value and the white OLED 18 will also be designed to provide this same peak luminance.

It should be noted however, that under certain circumstances it may be desirable to design the color of the additional element 18 to provide a color point other than the display white point inside the gamut defined by the red, green, and blue elements. For example by biasing the color of the additional or "white" element 18 towards the color of one of the gamut elements, the designer reduces the reliance of the display on gamut element toward which the additional element is biased.

It may also be desirable to set the peak luminance of the additional element to other luminance values, including lower values, such as half the luminance of the peak luminance of the combined gamut elements which increases the reliance on the gamut elements while reducing the reliance on the additional element. The peak luminance of the additional element may also be designed to higher values, such as one and a half times the peak luminance of the combined gamut elements. However, this bias can result in loss of saturation for colors that are high in luminance that should be rendered as high in saturation.

Once the display is designed to provide the correct luminance value for each element, a suitable method is employed to map from a conventional three-channel data signal to a four-channel signal, for example using a suitable look-up table. Methods of generating lookup tables for converting a three channel data signal to drive a display having four or more color channels are well-known in the art, for example, U.S. Pat. No. 6,075,514 issued Jun. 13, 2000 to Ryan, provides one such method. Alternatively, the conversion may be accomplished in real time using an algorithm that specifies the conversion.

Because the transform from three to four colors is non-deterministic, (i.e. many colors in the conventional specification can be created with either combinations of the gamut elements alone or in one of many combinations with the additional element), different conversions are possible. However, by selecting the peak luminance of the additional element to match the combined peak luminances of the gamut elements, it is possible to perform the conversion to allow the additional element to provide as much luminance to each color as possible while maintaining saturation of all colors. This approach provides the maximum power savings possible with the present invention.

Figure 10:
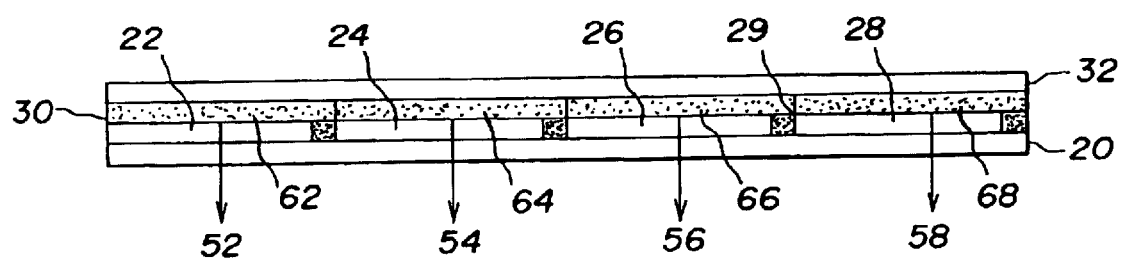
FIG. 10 is a side view of a portion of a top-emitting OLED display according to another embodiment of the present invention.

Various other embodiments of this invention may also be practiced. A second particularly useful embodiment includes the use of several different OLED materials that are doped to provide multiple colors. For example, the red 12, green 14, blue 16 and white 18 OLEDs may be composed of different OLED materials that are doped to produce different colored OLEDs. Referring to FIG. 10, in this embodiment, on each first electrode 22–28 a different layer of organic light emitting diode materials 62–68 respectively is formed. Over the organic light emitting diode materials a second electrode 32 is formed. Each of the organic light emitting diode materials (e.g., 62, 64, 66 and 68) are formed from a hole injecting layer, a hole transporting layer, a light emitting layer, and an electron transporting layer as described in more detail below.

In this embodiment, the light emitting layer and potentially other layers within the stack of organic light emitting diode materials are selected to provide a red, green, blue, and white light emitting elements. One light emitting diode material 62 emits light primarily in the long wavelength or red portion of the visible spectrum. A second light emitting diode material 64 emits light primarily in the middle wavelength or green portion of the visible spectrum. A third light emitting diode material 66 emits light primarily in the short wavelength or blue portion of the visible spectrum. Finally, the fourth light emitting diode material 68 emits light in a broad range of wavelengths, producing a white OLED. In this way, the four different materials form a four-OLED display including red, green, blue, and white OLEDs.

In this implementation, OLEDs formed from materials that are doped to produce different colors may have significantly different luminance efficiencies and therefore it may be desirable to select a white OLED with chromaticity coordinates that are biased towards the chromaticity coordinate of the OLED with the lowest power efficiency. By selecting the chromaticity coordinate of the white OLED in this way, the element with the lowest power efficiency is replaced more often by the white OLED, decreasing the overall power usage.

Further, within this implementation, the different OLEDs may need to be driven at different levels to produce a color-balanced display. It is important to realize that the stability of OLED materials is inversely related to the current density that is used to drive the OLED. The lifetime of an OLED is influenced by the stability (i.e., the current density used to drive the OLED), therefore, the need to drive some elements with a higher current density may shorten the life of the OLEDs of the given color. Further, OLED materials that are doped to produce different colors typically have different luminance stabilities. That is, the change in luminance output that occurs over time is different for the different materials. To account for this, a material may be employed for the white OLED having a chromaticity coordinate that is positioned closer to the OLED with the shortest luminance stability than to the chromaticity coordinates of the other gamut defining OLEDs. Positioning the white OLED according to this criteria reduces the overall usage of the closest gamut-defining OLED, extending the lifetime of the closest gamut-defining OLED.

In the embodiments that have been discussed above, it is important to note that because the additional element is significantly more efficient than the gamut elements, the current density or power required to drive the additional element is significantly lower than for the gamut elements. It is also important to note that the luminance stability over time of the materials used to create the light emitting elements is typically related to the current density used to drive the elements through a very non-linear function in which the luminance stability over time of the material is much poorer when driven to higher current densities. In fact, the function used to describe this relationship can typically be described as a power function. For this reason, it is not desirable to drive any elements to current densities that are higher than a given threshold where the function describing the luminance stability over time is particularly steep. At the same time, it may be desirable to achieve maximum display luminance values that would typically require the gamut elements to be driven to this current density.

Figure 9:
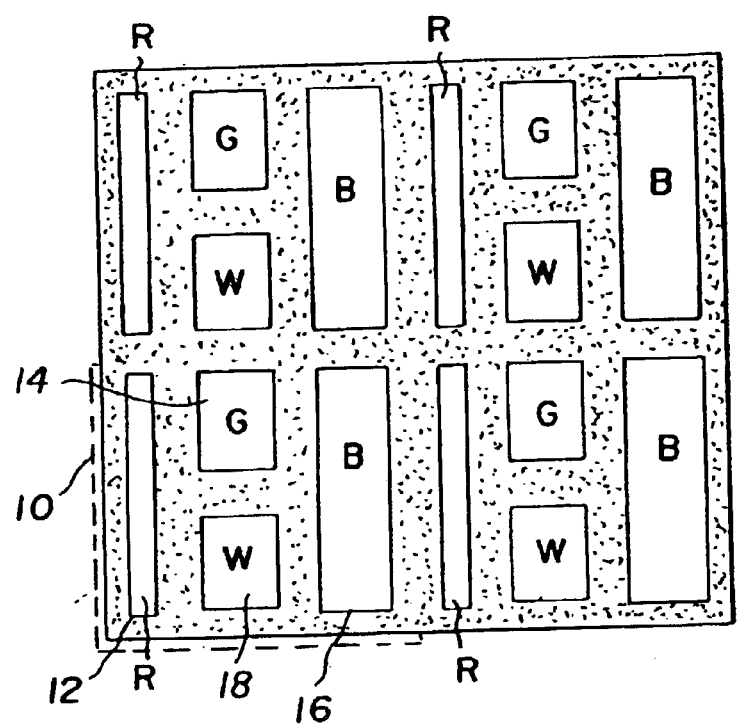
FIG. 9 is a schematic diagram of a portion of an OLED display having light emitting elements arranged according to another alternative embodiment of the present invention.

In the embodiments described thus far, the various light emitting elements will have different efficiencies and lifetimes. To optimize a display device for various applications it is useful to use different sized elements. For example, in applications for which black-and-white use dominates, the additional white OLED elements can be increased in size. It should also be recognized that as the amount of luminance that is dedicated to the additional element is manipulated, it may also be desirable to change their relative sizes. U.S. Pat. No. 6,366,025 issued Apr. 2, 2002 to Yamada, describes an electro-luminescent color display device having red, green, and blue light emitting elements having different areas to take into consideration the differing emission efficiencies and luminance ratios of the light emitting elements. The concept described by Yamada can be applied to the display device of the present invention. Referring to FIG. 9, a display having elements of varying areas depending on expected usage, efficiency and lifetime is shown.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sept. 6, 1988 to Tang et al., and U.S. Pat. No. 5,061,569, issued Oct. 29, 1991 to VanSlyke et al. Many combinations and variations of organic light emitting displays can be used to fabricate such a device.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

Figure 19:
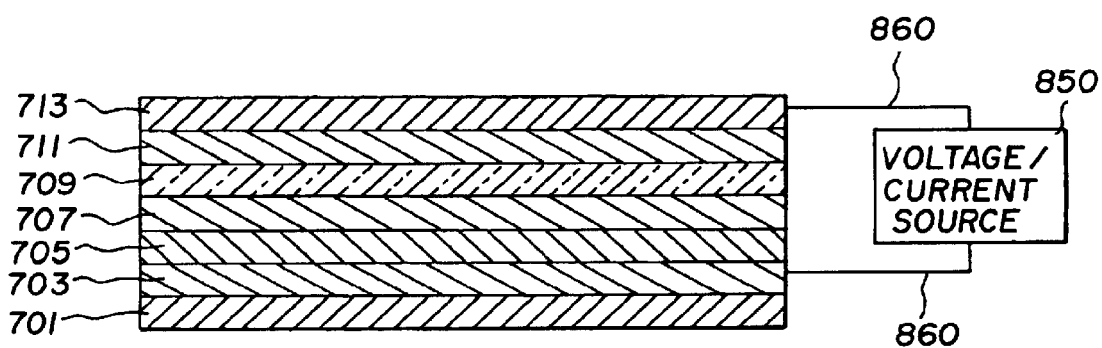
FIG. 19 is a schematic side view of an OLED light emitting element according to the prior art.

There are numerous configurations of the organic layers wherein the present invention can be successfully practiced. A typical structure is shown in FIG. 19 and is comprised of a substrate 701, an anode 703, a hole-injecting layer 705, a hole-transporting layer 707, a light-emitting layer 709, an electron-transporting layer 711, and a cathode 713. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 850 through electrical conductors 860. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC-driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be transmissive or opaque. In the case wherein the substrate is transmissive, a reflective or light absorbing layer is used to reflect the light through the cover or to absorb the light, thereby improving the contrast of the display. Substrates can include, but are not limited to, glass, plastic, semiconductor materials, silicon, ceramics, and circuit board materials. Of course it is necessary to provide a light-transparent top electrode.

Anode

When EL emission is viewed through anode 703, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 705 between anode 703 and hole-transporting layer 707. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 707 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 709 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos.

4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-☐-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2', 2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Electron-Transporting Layer (ETL)

Preferred thin film-forming materials for use in forming the electron-transporting layer 711 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223 6,140,763, 6,172,459, EP 1 076 368, U.S. Pat. Nos. 6,278,236, and 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276, 380 and EP 0 732 868, laser ablation, and selective chemical vapor deposition.

Other Common Organic Layers and Device Architecture

In some instances, layers 709 and 711 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. Pat. No. 20020025419, EP 1 182 244, U.S. Pat. Nos. 5,683,823, 5,503,910, 5,405,709, and 5,283,182.

Additional layers such as electron or hole-blocking layers as taught in the art may be employed in devices of this invention. Hole-blocking layers are commonly used to improve efficiency of phosphorescent emitter devices, for example, as in U.S. Pat. No. 20020015859.

This invention may be used in so-called stacked device architecture, for example, as taught in U.S. Pat. Nos. 5,703, 436 and 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos.

5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-lare or anti-reflection coatings may be specifically provided over the cover or an electrode protection layer beneath the cover.

The invention has been described in detail with particular reference to certain preferred embodiments thereof, but it will be understood that variations and modifications can be effected within the spirit and scope of the invention.

What is claimed is:

1. A color OLED display, comprising:
    a) an array of light emitting OLED pixels, each pixel having three or more gamut elements for emitting different colors of light specifying a gamut and at least one additional element for emitting a color of light within the gamut and wherein the power efficiency of the additional element is higher than the power efficiency of at least one of the three or more gamut elements;
    b) wherein all of the gamut elements for each color in the display are arranged in a first direction in a line such that no differently colored gamut element is in the line;
    c) wherein the colored gamut elements are arranged in a second direction orthogonal to the first direction in a line such that the colors of the gamut elements alternate in that line; and
    d) wherein the additional elements are arranged in lines in both the first and second directions.

2. The display claimed in claim 1, wherein the three or more gamut elements emit red, green, and blue colors of light.

3. The display claimed in claim 1, wherein the additional element emits white light.

4. The display claimed in claim 1, wherein the gamut elements are of different sizes.

5. The display claimed in claim 1, wherein the additional element is of a different size from one or more of the gamut elements.

6. The display claimed in claim 1, wherein the display is a top emitting device.

7. The display claimed in claim 1, wherein the display is a bottom emitting device.

8. The display claimed in claim 1, wherein the display is an active matrix device.

9. The display claimed in claim 1, wherein the display is a passive matrix device.

10. The display claimed in claim 1, wherein the light emitted by each of the gamut elements has a narrower bandwidth than a bandwidth of light emitted by the additional elements.

11. The display claimed in claim 1, wherein the gamut elements emit red, green, and blue colors of light, the additional element emits white light, and the elements are arranged in an alternating sequence of red, green, blue, and white emitting elements in the second direction.

12. The display claimed in claim 1, wherein the gamut elements emit red, green, and blue colors of light, the additional element emits white light, and the element are arranged in an alternating sequence of red, green, white, and blue emitting elements in the second direction.

13. The display claimed in claim 1, wherein the gamut elements emit red, green, and blue colors of light, the additional element emits white light, and the elements are arranged in an alternating sequence of red, white, green, and blue emitting elements in the second direction.

14. The display claimed in claim 1, wherein the gamut elements emit red, green, and blue colors of light, the additional element emits white light, and the gamut elements are arranged in a sequence that alternates in the second direction while the additional elements alternate with the gamut elements in the second direction, and reflections and rotations thereof.

15. The display claimed in claim 14, wherein the additional element extends the same distance in the first direction as the gamut elements taken together.

16. The display claimed in claim 1, wherein the gamut elements emit red, green, and blue colors of light, the additional element emits white light, and the additional element is arranged between two of the gamut elements in a pixel, and reflections and rotations thereof.

17. The display claimed in claim 16, wherein the additional element and the green light emitting gamut element are arranged between the red and blue light emitting gamut elements and the green light emitting element is located above or below the white element and reflections and rotations thereof.

18. The display claimed in claim 1, wherein the gamut elements emit red, green, and blue colors of light, the additional element emits white light, and the additional element has a long dimension that is equal to the width or height of a pixel, and reflections and rotations thereof.

19. The display claimed in claim 8, wherein the pixels includes three gamut elements and one additional element, and further comprising active matrix drive circuitry associated with each light emitting element including a select transistor, a storage capacitor, and a power transistor.

20. The display claimed in claim 19, where each pixel is driven by four data lines, each data line being connected to a different light emitting element in the pixel.

21. The display claimed in claim 19, further comprising three power lines per pixel.

22. The display claimed in claim 19, further comprising two power lines per pixel in a row, two light emitting elements of each pixel being connected to each power line.

23. The display claimed in claim 22, wherein two of the four light emitting elements in a pixel are connected to a first power line and the other two light emitting elements are connected to a second power line.

24. The display claimed in claim 19, further comprising three power lines for every two adjacent pixels in a row.

* * * * *